(12) United States Patent
Arno

(10) Patent No.: US 9,698,565 B1
(45) Date of Patent: Jul. 4, 2017

(54) DIODE CONTROL DEVICE

(71) Applicant: STMicroelectronics (Alps) SAS, Grenoble (FR)

(72) Inventor: Patrik Arno, Sassenage (FR)

(73) Assignee: STMicroelectronics (Alps) SAS, Grenoble (FR)

( * ) Notice: Subject to any disclaimer, the term of this patent is extended or adjusted under 35 U.S.C. 154(b) by 0 days.

(21) Appl. No.: 15/083,921

(22) Filed: Mar. 29, 2016

(30) Foreign Application Priority Data

Dec. 24, 2015 (FR) ...................... 15 63353

(51) Int. Cl.
*H01S 3/00* (2006.01)
*H01S 5/042* (2006.01)
*H01S 5/026* (2006.01)
*H01S 5/062* (2006.01)
*H01S 5/068* (2006.01)

(52) U.S. Cl.
CPC ............ *H01S 5/042* (2013.01); *H01S 5/0261* (2013.01); *H01S 5/06223* (2013.01); *H01S 5/06808* (2013.01); *H01S 5/06812* (2013.01)

(58) Field of Classification Search
CPC .... H01S 5/042; H01S 5/0261; H01S 5/06808; H01S 5/06812; H01S 5/06223
USPC .......................................... 372/38.01, 38.07
See application file for complete search history.

(56) References Cited

U.S. PATENT DOCUMENTS 6,310,901 B1 * 10/2001 Mahmoudi ............. H01S 3/097
363/142
7,679,295 B1 * 3/2010 Collins ................. H02M 3/156
315/225
2005/0110469 A1 * 5/2005 Inaba ..................... H02M 3/156
323/222
2007/0247450 A1 * 10/2007 Lee ..................... H05B 33/0818
345/204
2008/0284346 A1 * 11/2008 Lee ..................... H05B 33/0818
315/224
2015/0381037 A1 * 12/2015 Romeo ................ H02M 3/156
323/282

OTHER PUBLICATIONS

INPI Search Report and Written Opinion for FR 1563353 dated Aug. 16, 2016 (9 pages).
Day, Jacob, et al: "Transient Current Regulation Using a Single DC-DC Converter for High-Efficiency RGB LEDs," 2011 IEEE (4 pgs.).
Malcovati, Piero et al: "A 0.18-μm CMOS, 91%-Efficiency, 2—A Scalable Buck-Boost DC-DC Converter for LED Drivers," IEEE Transactions on Power Electronics, vol. 29, No. 10, Oct. 2014 (pp. 5392-5398).

* cited by examiner

*Primary Examiner* — Kinam Park
(74) *Attorney, Agent, or Firm* — Gardere Wynne Sewell LLP

(57) ABSTRACT

A diode control device include a first terminal for receiving a first power supply voltage and a second terminal for receiving a second power supply voltage. A circuit of the diode control device applies a regulated voltage on the anode of the diode in response to a control voltage. The control voltage is equal to a preset voltage when a reference voltage is less than or equal to zero. Conversely, when the reference voltage is greater than zero, the control voltage is equal to the sum of the present voltage and a difference between cathode voltage of the diode and the reference voltage.

18 Claims, 3 Drawing Sheets

DIODE CONTROL DEVICE

PRIORITY CLAIM

This application claims the priority benefit of French Application for Patent No. 1563353, filed on Dec. 24, 2015, the contents of which are hereby incorporated by reference.

TECHNICAL FIELD

The present disclosure generally relates to electronic circuits and more particularly to devices for controlling the light intensity of laser or light-emitting diodes.

BACKGROUND

Devices for controlling the light intensity of laser or light-emitting diodes generally comprise a current source which imposes the intensity of the current flowing through the diode according to the required light intensity.

Certain systems further comprise a regulation of the voltage applied across the diode to minimize the voltage drop across the current source. However, there remains a significant energy loss due to the current source which is in series with the diode.

It is thus needed to improve the energy performance of diode control devices.

SUMMARY

Thus, an embodiment provides improving the electric power consumption of devices for controlling the light intensity of laser or light-emitting diodes.

More particularly, an embodiment provides a diode control device comprising: a first terminal of application of a first power supply voltage; a second terminal of application of a second power supply voltage; a circuit of application of a voltage onto a third terminal intended to be connected to an anode of the diode, said third terminal being connected to a first input terminal of said circuit; a second input terminal of said circuit; and a resistor coupled between said second terminal and a fourth terminal intended to be connected to a cathode of said diode, said fourth terminal being coupled to a third input terminal of the circuit.

According to an embodiment, the voltage provided by said circuit on the third terminal is a function of signals present on the first, second, and third input terminals of said circuit.

According to an embodiment, said circuit comprises: a circuit for generating said voltage on said third terminal, comprising a first input terminal intended to receive a signal and a second input terminal connected to said first input terminal of said circuit; a comparator having a first input connected to said third input terminal and having a second input connected to said second input terminal; and an adder having a first input connected to the output of said comparator and having a second input connected to a terminal of application of a voltage, the output of the adder being connected to said first input terminal of the circuit for generating said voltage.

According to an embodiment: if a first voltage applied to the second input of the comparator has a value smaller than or equal to zero, the voltage generation circuit applies onto the anode of the diode a second voltage having a value equal to the voltage applied to said second input terminal of the adder; and if said first voltage has a positive value, the voltage generation circuit applies onto the anode of the diode a voltage having a value equal to the sum of the values of the output voltage of said comparator and of said second voltage.

According to an embodiment, the voltage applied onto the second input terminal of the comparator has a positive value smaller than the conduction threshold of the diode.

An embodiment provides a system comprising: a diode control device; and a diode.

According to an embodiment, the diode is a laser diode.

According to an embodiment, the diode is a light-emitting diode.

An embodiment provides a diode control method comprising the steps of: a) applying a first voltage onto an anode of said diode according to the value of a control voltage; and b) applying onto a cathode of said diode a second voltage having as a value the product of the value of the current flowing through the diode and of the value of a resistor coupled between said cathode of the diode and the ground.

According to an embodiment, the setting of the value of said first voltage comprises the steps of: c) initializing a third voltage to a positive value smaller than or equal to a conduction threshold of said diode; d) estimating the value of said control voltage; e) setting the value of a fourth voltage to the zero value if the value of said control voltage is smaller than or equal to zero; f) setting the value of said fourth voltage to a positive value if the value of the control voltage is positive; g) setting the value of a fifth voltage to the sum of the values of the fourth and third voltages; and h) setting the value of the first voltage to a multiple of the value of said fifth voltage.

In an embodiment, a circuit for controlling a diode having an anode terminal and a cathode terminal comprises: a DC-DC converter circuit configured to generate an anode voltage for direct application to the anode terminal in response to a control voltage, said anode voltage being regulated by the DC-DC converter circuit to substantially equal the control voltage; a comparison circuit configured to determine a difference between a cathode voltage at the cathode terminal and a first reference voltage and generate an error voltage; and an adder configured to add a second reference voltage to the error voltage to generate the control voltage.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION

Figure 1:
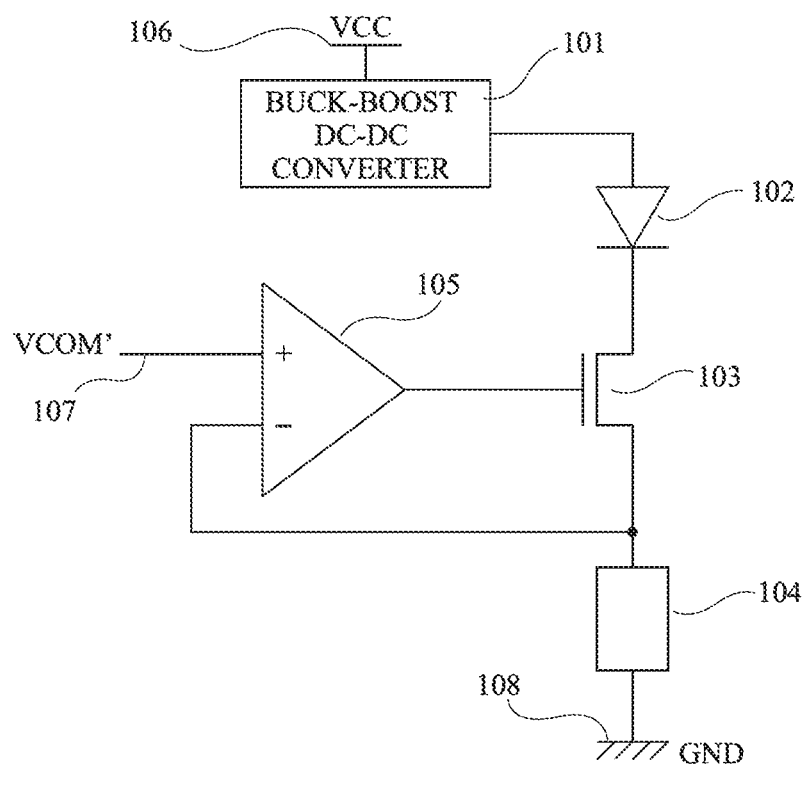
FIG. 1 shows a device for controlling the light intensity of a laser diode or of a light-emitting diode.

The same elements have been designated with the same reference numerals in the different drawings. For clarity, only those elements which are useful to the understanding of the described embodiments have been shown and are detailed. In particular, the functions of the boost DC/DC converters have not been detailed, the described embodiments being compatible with usual converters.

Unless otherwise specified, expressions "approximately", "substantially", and "in the order of" mean to within 10%, preferably to within 5%.

FIG. 1 shows a device for controlling the light intensity of a diode. The device comprises a buck-boost DC/DC converter 101, a diode 102, an NMOS transistor 103, and a resistor 104, connected in series between a first terminal 106 of application of a power supply voltage VCC and a ground connection terminal 108. The gate of transistor 103 is coupled to the output of a differential amplifier 105 operating as a comparator, having its inverting input coupled to the source of transistor 103 and to the terminal of resistor 104 which is not grounded. The non-inverting input of comparator 105 is connected to a terminal 107 of application of a control voltage VCOM'.

Transistor 103 operates as a voltage-controlled current source by application of the output voltage of comparator 105 on its gate. The current which flows through the transistor is converted into a voltage at the level of its source due to resistor 104. This voltage is then compared with control voltage VCOM'. The output voltage of comparator 105 is adjusted according to the result of the comparison.

Further, to keep diode 102 conductive, converter 101 imposes a voltage on its anode, so that the voltage across the diode is greater than the conduction threshold of the diode. The function of converter 101 is to maintain (regulate) the voltage independent of possible fluctuations of the power supply voltage.

A disadvantage of this device is the electric power consumption.

A first cause of electric power consumption is that the target voltage applied by converter 101 onto the anode of diode 102 is decorrelated from the current regulation. This target voltage regulated by converter 101 is defined according to the type of diode used. However, it is necessary to provide a margin to make sure that the voltage applied across diode 102 is sufficient to keep it conductive independently from manufacturing tolerances and from the operating conditions of the device, for example, temperature variations. This margin results in an additional power consumption at the level of DC/DC converter 101.

A second cause of electric power consumption is the presence of the current source (transistor 103) in series with diode 102.

Figure 2:
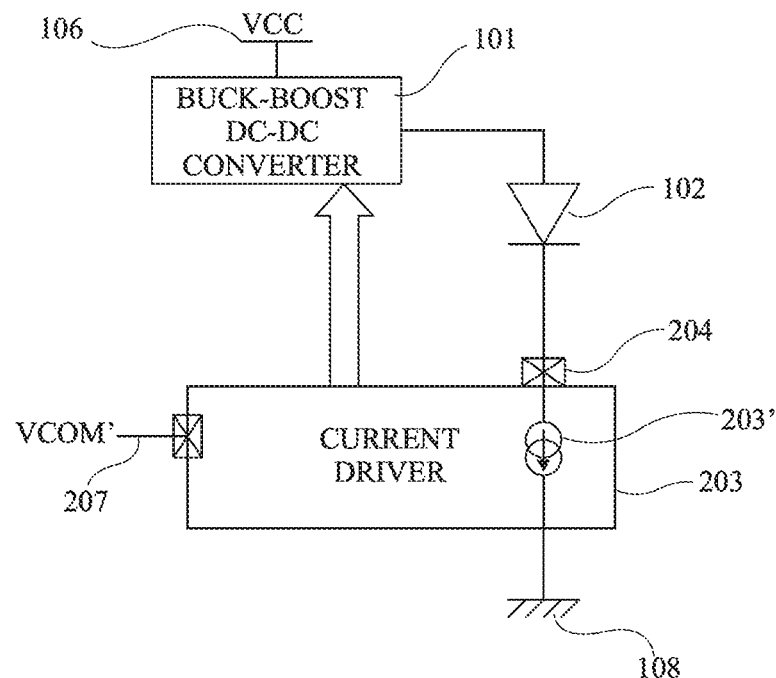
FIG. 2 shows a device for controlling the light intensity of a laser diode or of a light-emitting diode.

FIG. 2 shows a device for controlling the light intensity of a diode.

As compared with the device of FIG. 1, the device of FIG. 2 comprises a current driver circuit 203 for controlling the current in the diode which replaces the assembly formed of differential amplifier 105, of transistor 103, and of resistor 104 of FIG. 1. The current driver circuit 203 is on the one hand coupled between the cathode of diode 102 and the terminal of application of ground 108, and on the other hand connected to buck-boost DC/DC converter 101. The current driver circuit 203 further comprises a terminal 207 of application of a control voltage VCOM'.

Circuit 203 imposes a current in diode 102 via an internal current source 203' according to control voltage VCOM'. The difference with the device of FIG. 1 is that a feedback loop which exists between circuit 203 and converter 101 enables to ensure the application of a minimum voltage across diode 102 to keep it conductive independently from manufacturing tolerances and from the operating conditions. Such a device thus enables to do away with the necessary margin provided in the case of the device of FIG. 1. This results in an improvement of the electric power consumption due to converter 101. However, current source 203', present in control circuit 203 in series with diode 102, remains a significant source of energy loss.

According to the embodiments described hereafter, it is provided to do away with the current source in series with the diode.

Figure 3:
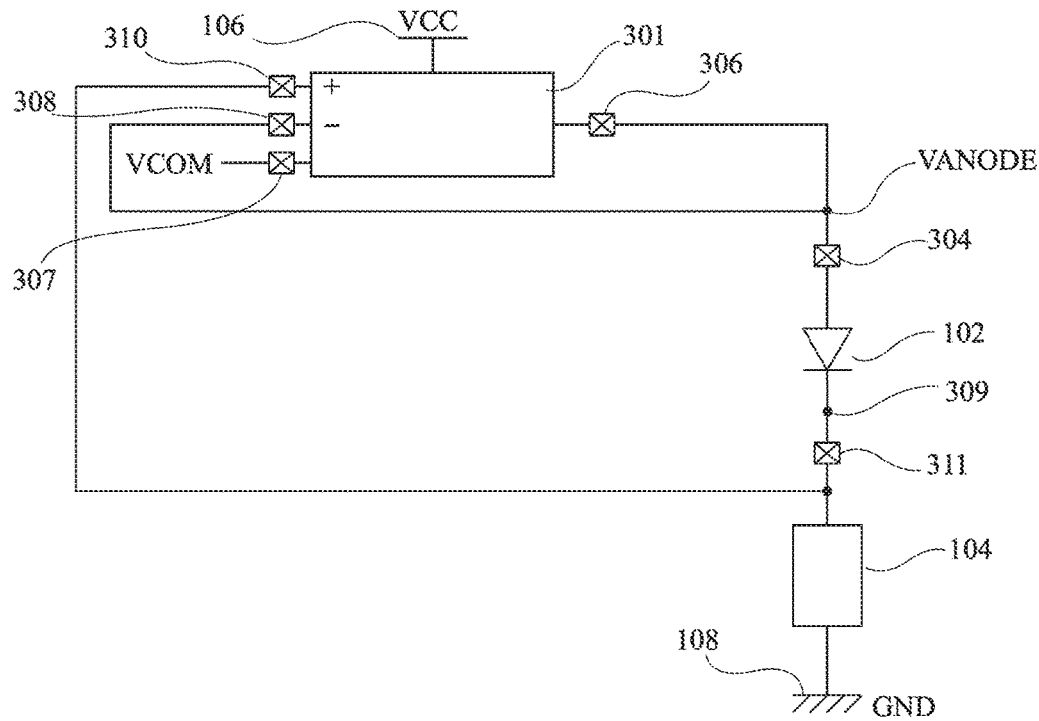
FIG. 3 shows a device for controlling the light intensity of a laser diode or of a light-emitting diode.

FIG. 3 shows a device for controlling the light intensity of a laser diode or of a light-emitting diode.

The device comprises a diode 102 and a resistor 104 connected in series between an output terminal 306 of a circuit 301 of application of a voltage VANODE on the anode of the diode, and a ground connection terminal 108. Circuit 301 further comprises an input terminal 310 coupled to the cathode of diode 102, an input terminal 308 coupled to the anode of diode 102, an input terminal 307 having a control voltage VCOM applied thereto, and a terminal 106 for application of a power supply voltage VCC. Circuit 301 itself comprises a DC/DC converter which is not detailed herein.

Circuit 301 imposes voltage VANODE on the anode of diode 102 to control the current flowing therethrough according to set point VCOM. This voltage applied onto the anode of the diode is regulated by two feedback loops.

Where set point VCOM has a value smaller than or equal to zero, in a first loop which couples the anode of diode 102 to terminal 308 of circuit 301, circuit 301 provides across the diode a positive voltage VPRESET smaller than or equal to the conduction threshold of the diode.

When set point VCOM has a positive value, in a second loop which couples the cathode of diode 102 to terminal 310 of circuit 301, circuit 301 compares the voltage applied across resistor 104 with the control set point and accordingly adjusts the voltage applied on the anode of the diode to a value greater than voltage VPRESET. The value of the voltage applied across resistor 104 is obtained by the product of value R of resistor 104 and of the value of current I flowing through the diode, to within the error of the current sampled by input terminal 310. The error may be zero according to the nature of the input stage connected to terminal 310. This second loop thus controls the current flowing through diode 102 according to a voltage VCOM.

A device for controlling the light intensity of a laser or light-emitting diode which uses no current source in series with the diode has thus been formed, which enables to improve power consumption.

Figure 4:
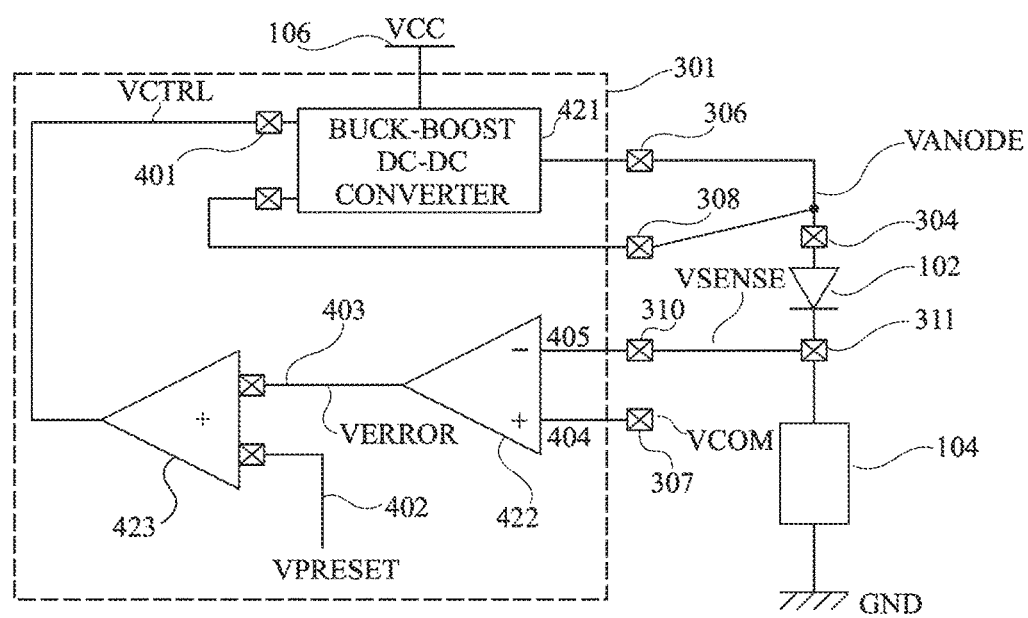
FIG. 4 is a circuit of the control device of FIG. 3.

FIG. 4 shows the circuit 301 of application of voltage VANODE of FIG. 3.

Circuit 301 comprises a buck boost DC-DC converter circuit 421 for generating voltage VANODE at the anode of diode 102 comprising an input terminal 401 receiving a signal VCTRL and another input terminal 308 configured to be connected to the anode of the diode. Circuit 301 further comprises, between terminal 310 (connected with terminal 311) configured to be connected to the cathode of diode 102 and input terminal 401 of circuit 421, a comparator 422. An input terminal 405 of comparator 422 is connected to terminal 310 for application of a voltage VSENSE from the cathode of the diode. Another input terminal 404 of the comparator is connected to terminal 307 for application of control voltage VCOM. Circuit 301 further comprises an adder 423, having an input terminal 403 connected to the output of comparator 422 (to receive the voltage VERROR), and having another input terminal 402 connected to a terminal for application of a second control voltage VPRESET. The output of adder 423 is connected to input terminal 401 of circuit 421. Further, as in the case of FIG. 3, the forming of the DC/DC converter comprised in circuit 421 is not detailed, such circuits being well known to those skilled in the art.

Figure 5:
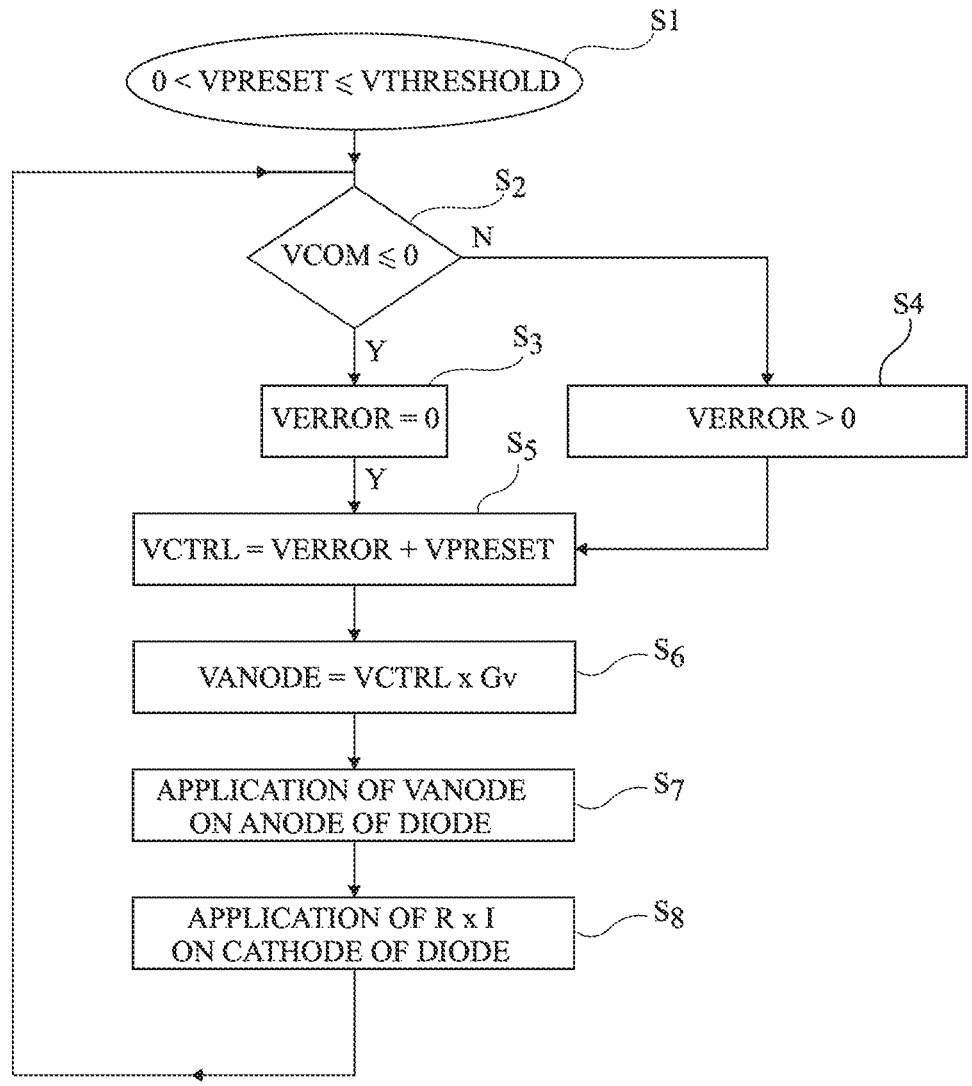
FIG. 5 illustrates a method of controlling the light intensity of a laser diode or of a light-emitting diode.

FIG. 5 shows steps of a method describing the operation of the device of FIG. 4.

At step S1, voltage VPRESET applied to input terminal 402 of adder 423 is initialized to a positive value smaller than or equal to the conduction threshold (VTHRESHOLD) of diode 102. At step S2, the voltage VCOM applied to terminal 307 (input terminal 404 of comparator 422) is compared to a threshold. If the voltage value is smaller than or equal to zero (output Y of block S2), the voltage VERROR of comparator 422 takes the value zero at step S3. If not (output N of block S2), the output voltage VERROR of comparator 422 takes as a value, at step S4, greater than zero and equal to the product of the voltage gain value of comparator 422 by the value of the difference between voltage VCOM and voltage VSENSE. In an embodiment comprising a positive power supply terminal VCC and a ground terminal, voltage VERROR will be positive. At step S5, output voltage VCTRL of adder 423 takes as a value the sum of voltages VPRESET and VERROR. At step S6, circuit 421 applies onto the anode of the diode the voltage VANODE according to the value of voltage VCTRL. This function is the product by gain Gv between output terminal 306 of circuit 421 and input terminal VCTRL. Thus, VANODE=Gv×VCTRL. Gain Gv is greater than or equal to 1 according to the needs of the application. This results, at step S7, in the application of voltage VANODE on the anode of the diode and, at step S8, in the application of voltage VSENSE on the cathode of the diode having a value equal to the product of value R of resistor 104 and of current I flowing through the diode. It is then returned to step S2 for the processing of a new voltage value VCOM.

A device and a method for controlling the light intensity of a laser or light-emitting diode which uses no current source in series with the diode have thus been formed, which enables to gain power consumption. It should be noted that the method of FIG. 5 also applies to the operation of the device described in FIG. 3.

Specific embodiments have been described. Various alterations, modifications, and improvements will occur to those skilled in the art. In particular, the value of voltage VPRESET will be for example determined according to the constraints of activation or deactivation of the diode or to any other constraint associated with the system. Further, those skilled in the art will select the structure of the DC/DC converter according, for example, to the type of diode, to the power supply type, or to any other constraint associated with the needs of the targeted application. The embodiments have been described by referring to a positive power supply voltage and to ground. They easily transpose to other choices of pairs of power supply voltages, including negative.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A device for controlling a diode, comprising:
   a first terminal configured to receive a first power supply voltage;
   a second terminal configured to receive a second power supply voltage;
   a circuit configured to apply a voltage onto a third terminal configured to be connected to an anode of the diode, said third terminal being connected to a first input terminal of said circuit;
   a second input terminal of said circuit; and
   a resistor coupled between said second terminal and a fourth terminal configured to be coupled to the cathode of said diode, said fourth terminal being coupled to a third input terminal of the circuit;
   wherein the circuit comprises:
      a converter circuit configured to generate said voltage applied to the third terminal as a function the signal at the first input terminal and a control signal;
      a comparator configured to compare the signal at the second input terminal to the signal at the third input terminal to generate an error signal; and
      an adder configured to selectively add the error signal to a preset voltage to generate said control signal for application to the converter circuit.

2. The device of claim 1, wherein:
   if a first voltage of the signal at the second input of the comparator has a value smaller than or equal to zero, the circuit applies onto the anode of the diode a second voltage having a value equal to the preset voltage; and
   if said first voltage of the signal at the second input of the comparator has a positive value, the circuit applies onto the anode of the diode a voltage having a value equal to the sum of the error signal and said preset voltage.

3. The device of claim 2, wherein the preset voltage has a positive value smaller than a conduction threshold of the diode.

4. The device of claim 1, wherein the diode is a laser diode.

5. The device of claim 4, wherein the diode is a light-emitting diode.

6. A circuit for controlling a diode having an anode terminal and a cathode terminal, comprising:
   a DC-DC converter circuit configured to generate an anode voltage for direct application to the anode terminal in response to a control voltage, said anode voltage being regulated by the DC-DC converter circuit to a voltage as a function of the control voltage;
   a comparison circuit configured to determine a difference between a cathode voltage at the cathode terminal and a first reference voltage and generate an error voltage; and
   an adder configured to add a second reference voltage to the error voltage to generate the control voltage.

7. The circuit of claim 6, wherein said comparison circuit is further configured, if the first reference voltage is less than or equal to a threshold voltage, to generate the error voltage equal to zero so that the control voltage is equal to the second reference voltage.

8. The circuit of claim 7, wherein the second reference voltage is less than a conduction threshold of the diode.

9. The circuit of claim 8, wherein said comparison circuit is further configured, if the first reference voltage is greater than the threshold voltage, to generate the error voltage equal to the difference between the cathode voltage at the cathode terminal and the first reference voltage.

10. The circuit of claim 6, further comprising a resistor connected between the cathode terminal and a supply node.

11. The circuit of claim 6, wherein the diode is a laser diode.

12. The circuit of claim 11, wherein the diode is a light-emitting diode.

13. The circuit of claim 6, wherein the anode voltage is equal to the control voltage multiplied by a gain value.

14. A circuit for controlling a diode, comprising:
a voltage generator circuit configured to output an anode voltage to said diode, said voltage generator circuit including:
   a first loop coupled to the diode, said first loop operating to control the anode voltage to provide a positive voltage across said diode that is smaller than or equal to a conduction threshold of the diode; and
   a second loop coupled to the diode, said second loop operating to control the anode voltage to provide a positive voltage across said diode that is greater than the conduction threshold of the diode; and
a control input configured to receive a control voltage having a first level for enabling the first loop and a second level for enabling the second loop.

15. The device of claim 14, wherein the first control loop controls the anode voltage according to a preset voltage.

16. The device of claim 14, further comprising a resistor connected in series with the diode and configured to generate a sense voltage in response to a current through the diode.

17. The device of claim 16 wherein:
the first level of the control voltage is less than or equal to the sense voltage; and
the second level of the control voltage is greater than the sense voltage.

18. The device of claim 16, wherein the second loop controls the current through the diode according to a difference between the control voltage and the sense voltage.

\* \* \* \* \*